(12) United States Patent
Shin et al.

(10) Patent No.: US 10,950,154 B2
(45) Date of Patent: Mar. 16, 2021

(54) DISPLAY DEVICE AND METHOD FOR MANUFACTURING THE SAME

(71) Applicant: Samsung Display Co., Ltd., Yongin-si (KR)

(72) Inventors: Kwan-Yup Shin, Yongin-si (KR); Jun-Ho Bae, Asan-si (KR); Jae Hyoung Youn, Hwaseong-si (KR); Da Young Lee, Seoul (KR); Jin Young Lee, Cheonan-si (KR); Hyeok Jun Lee, Goyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/292,326

(22) Filed: Mar. 5, 2019

(65) Prior Publication Data
US 2020/0020263 A1    Jan. 16, 2020

(30) Foreign Application Priority Data

Jul. 13, 2018    (KR) .................. 10-2018-0081630

(51) Int. Cl.
G09G 3/20 (2006.01)
G02F 1/1345 (2006.01)
G02F 1/1362 (2006.01)
H01L 27/32 (2006.01)

(52) U.S. Cl.
CPC .......... *G09G 3/20* (2013.01); *G02F 1/13458* (2013.01); *G02F 1/136286* (2013.01); *H01L 27/3276* (2013.01); *G09G 2300/0408* (2013.01); *G09G 2300/0426* (2013.01); *G09G 2300/0439* (2013.01); *G09G 2310/0286* (2013.01); *G09G 2310/08* (2013.01)

(58) Field of Classification Search
CPC combination set(s) only.
See application file for complete search history.

(56) References Cited

U.S. PATENT DOCUMENTS

| 6,128,051 | A | 10/2000 | Kim et al. |
| 8,368,826 | B2 | 2/2013 | Kim et al. |
| 2005/0248550 | A1* | 11/2005 | Kobayashi ........... G09G 3/3696 345/204 |

(Continued)

FOREIGN PATENT DOCUMENTS

| KR | 10-0271038 | 8/2000 |
| KR | 10-0911467 | 8/2009 |
| KR | 10-2010-0070663 | 6/2010 |

*Primary Examiner* — Michael J Jansen, II
*Assistant Examiner* — Sosina Abebe
(74) *Attorney, Agent, or Firm* — H.C. Park & Associates, PLC

(57) ABSTRACT

A display device including: a display panel including a plurality of pixels arranged therein; a plurality of gate lines disposed in the display panel to transfer gate signals to the pixels; and a gate driver disposed in the display panel to include a plurality of stages that generate gate signals and output them to the gate lines. A first one of the stages is connected with a first one and a second one of the gate lines through a gate pad, the gate pad includes a first gate pad, a second gate pad, and a third gate pad, and the first gate pad, the second gate pad, and the third gate pad are connected with each other through a gate pad connecting member.

13 Claims, 11 Drawing Sheets

(56) References Cited

U.S. PATENT DOCUMENTS

| | | | |
|---|---|---|---|
| 2008/0165110 A1* | 7/2008 | Kim | G11C 19/28 345/99 |
| 2012/0081640 A1* | 4/2012 | Kim | G02F 1/13394 349/106 |
| 2014/0152629 A1* | 6/2014 | So | G09G 3/3266 345/205 |
| 2016/0370922 A1* | 12/2016 | Fan | G06F 3/0412 |
| 2018/0031935 A1 | 2/2018 | Gan | |

* cited by examiner

DISPLAY DEVICE AND METHOD FOR MANUFACTURING THE SAME

CROSS-REFERENCE TO RELATED APPLICATION

This application claims priority from and the benefit of Korean Patent Application No. 10-2018-0081630, filed on Jul. 13, 2018, which is hereby incorporated by reference for all purposes as if fully set forth herein.

BACKGROUND

Field

Exemplary embodiments of the invention relate generally to a display device and a manufacturing method thereof.

Discussion of the Background

A display device, such as a liquid crystal display (LCD) and an organic light emitting diode (OLED) display, includes a display panel on which an image is displayed and a driver such as a gate driver and a data driver for driving the display panel. The driver may be formed as a separate chip and may be electrically connected to the display panel. In recent years, a technique has been developed in which a gate driver is integrated in a display panel instead of using a chip.

The gate driver includes a transistor serving as a switching element and a capacitor serving as a capacitive storage element. When the gate driver is integrated into the display panel, the gate driver may be arranged in a peripheral area of the display panel, that is, a non-display area outside a display area on which an image is displayed.

Such a gate driver includes stages for generating and outputting a gate signal.

In the case of a high-definition display device, a number of gate lines for transferring gate signals is increased, and a plurality of gate lines may be connected to one stage. In this case, when the gate line is inspected for defects, a phenomenon in which a defect of the gate line is not detected may occur.

The above information disclosed in this Background section is only for understanding of the background of the inventive concepts, and, therefore, it may contain information that does not constitute prior art.

SUMMARY

Exemplary embodiments of the invention provide a display device including a gate driver capable of facilitating defect inspection of a gate line.

Additional features of the inventive concepts will be set forth in the description which follows, and in part will be apparent from the description, or may be learned by practice of the inventive concepts.

An exemplary embodiment of the invention provides a display device including: a display panel including a plurality of pixels arranged therein; a plurality of gate lines disposed in the display panel to transfer gate signals to the pixels; and a gate driver disposed in the display panel and including a plurality of stages that generate gate signals and output them to the gate lines. A first one of the stages is connected with a first one and a second one of the gate lines through a gate pad, the gate pad includes a first gate pad, a second gate pad, and a third gate pad, and the first gate pad, the second gate pad, and the third gate pad are connected with each other through a gate pad connecting member.

The display device may further include: a substrate including the gate pad, the first gate line, and the second gate line disposed therein; a gate insulating layer disposed on the substrate, the gate pad, the first gate line, and the second gate line; a stage connection line disposed on the gate insulating layer and connected with the first stage; and a passivation layer disposed on the gate insulating layer and the stage connection line, and the gate pad connecting member may be disposed on the passivation layer.

The display device may further include a stage connecting member disposed on the passivation layer to connect the third gate pad and the stage connection line.

The first gate pad may be connected with the first gate line, the second gate pad may be connected with the second gate line, and the third gate pad may include a gate pad extension connected with the stage connection line.

The passivation layer may include a pad first contact hole, a pad second contact hole, a stage first contact hole, and a stage second contact hole, the pad first contact hole may overlap the gate pad and the second gate pad, the pad second contact hole may overlap the third gate pad, the stage first contact hole may overlap the gate pad extension, and the stage second contact hole may overlap the stage connection line.

The gate pad connecting member may connect the first gate pad and the third gate pad through the pad first contact hole and the pad second contact hole, may connect the second gate pad and the third gate pad through the pad first contact hole and the pad second contact hole, and may connect the first gate pad and the second gate pad through the pad first contact hole.

The stage connecting member may connect the gate pad extension and the stage connection line through the stage first contact hole and the stage second contact hole.

One of the pixels may include: a gate electrode disposed on the substrate; a semiconductor layer disposed on the gate insulating layer; a source electrode and a drain electrode disposed on the gate insulating layer and the semiconductor layer to be separated from each other; and a pixel electrode disposed on the passivation layer, and connected with the drain electrode.

The gate pad and the gate electrode may include the same material, the stage connection line, the source electrode, and the drain electrode may include the same material, and the pixel electrode, the gate pad connecting member, and the stage connecting member may include the same material.

The display device may further include a plurality of data lines disposed on the display panel to transfer data signals to the pixels, the pixels may be disposed in a form of a plurality of rows and a plurality of columns, and one of the pixels may include a pixel transistor connected to one of the gate lines and one of the data lines, and a pixel electrode connected with the pixel transistor.

Pixel transistors of the pixels adjacent to each other in a column direction may be connected to a same data line.

The pixel transistors of the pixels adjacent to each other in a column direction may be connected to different data lines.

The pixel electrode may include a first subpixel electrode and a second subpixel electrode which are separated from each other, the pixel transistor may include a first pixel transistor connected with the first subpixel electrode and a second pixel transistor connected with the second subpixel electrode, and the first pixel transistor and the second pixel transistor may be connected with different data lines.

Pixel transistors of the pixels adjacent to each other in a column direction may be connected to different data lines for every two pixels.

Another exemplary embodiment of the invention provides a manufacturing method of a display device including a display panel including a plurality of pixels arranged therein, a plurality of gate lines disposed in the display panel to transfer gate signals to the pixels, and a gate driver disposed in the display panel to include a plurality of stages that generate gate signals and output them to the gate lines. A first one of the stages is connected with a first one and a second one of the gate lines through a gate pad, including: forming the gate pad including a first gate pad, a second gate pad, and a third gate pad, and gate lines on a substrate; forming a gate insulating layer on the gate pad and the gate lines; forming a semiconductor layer on the gate insulating layer; forming a source electrode and a drain electrode on the gate insulating layer and the semiconductor layer to be separated from each other; performing defect inspection on a first gate line and a second gate line of the gate lines; and connecting the first gate pad, the second gate pad, and the third gate pad.

The first gate pad may be connected with the first gate line, the second gate pad may be connected with the second gate line, and the defect inspection on the first gate line and the second gate line may be performed through the first gate pad and the second gate pad.

The connecting of the first gate pad, the second gate pad, and the third gate pad may include: forming a passivation layer on the gate insulating layer, the source electrode, and the drain electrode; and forming a pixel electrode and a gate pad connecting member on the passivation layer.

The forming of the source electrode and the drain electrode may include forming a stage connection line disposed on the gate insulating layer to be connected with the first stage.

The forming of the pixel electrode and the gate pad connecting member may include forming a stage connecting member on the passivation layer to connect the third gate pad and the stage connection line.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
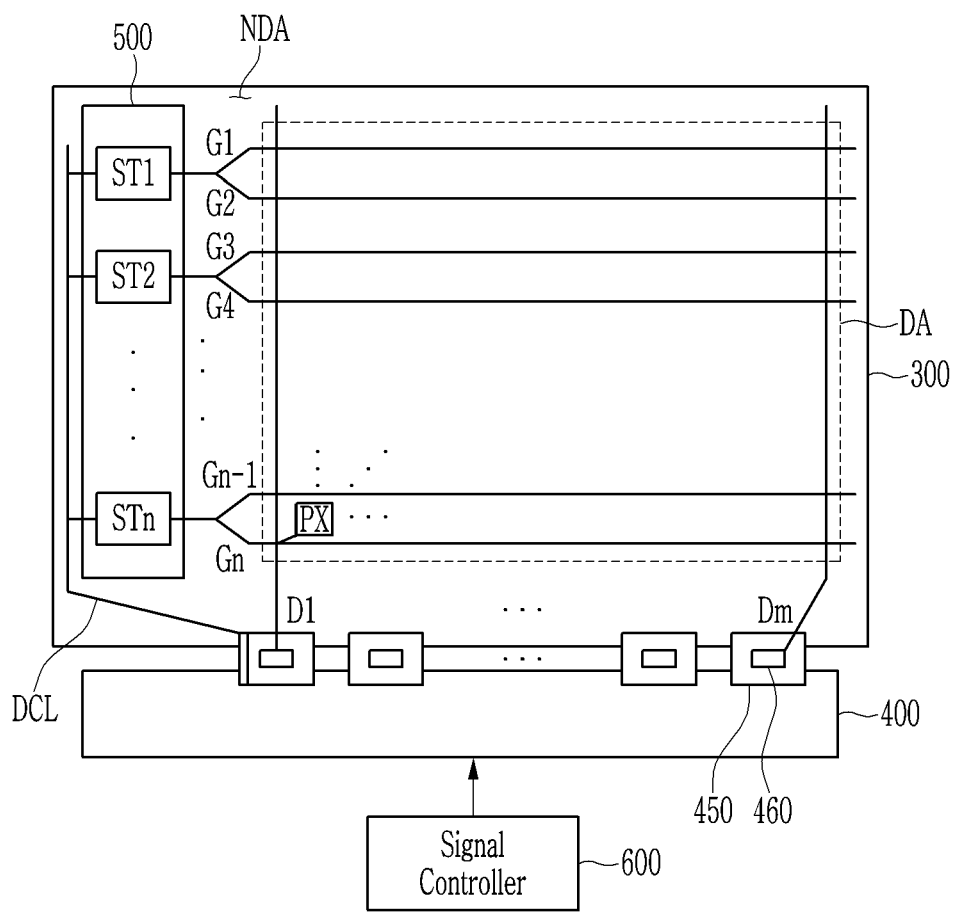
FIG. 1 schematically illustrates a display device according to an exemplary embodiment of the invention.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 schematically illustrates a display device according to an exemplary embodiment of the invention.

Referring to FIG. 1, the display device includes a display panel 300, a data driver 460, a gate driver 500, a signal controller 600, and the like.

The display panel 300 includes a display area DA for displaying an image and a non-display area NDA disposed around the display area DA. In the display panel 300, various elements and wires for receiving signals from the outside and displaying an image are formed on, e.g., a substrate.

Pixels PX for displaying an image and data lines D1 to Dm and gate lines G1 to Gn for applying signals to the pixels PX are disposed in the display area DA. The gate lines G1 to Gn and the data lines D1 to Dm may be insulated from each other and cross each other.

Each of the pixels PX includes a transistor, a liquid crystal capacitor, and a storage capacitor. A control electrode of the translator may be connected with a gate line, a first electrode (or input terminal) of the transistor may be connected with a data line, and a second electrode (or output terminal) of the translator may be connected with a first electrode of the storage capacitor. A second electrode of the liquid crystal capacitor may be connected with a common electrode to receive a common voltage, and a second electrode of the storage capacitor may receive a storage voltage.

The display device according to an exemplary embodiment may be a light-emitting display device. In this case, the pixel PX includes at least two transistors including a switching transistor and a driving transistor, at least one storage capacitor, and a light emitting element (light emitting diode), and may further include at least one compensation transistor.

The gate driver 500 for applying a gate signal to the gate lines G1 to Gn is disposed in the non-display area NDA. The gate driver 500 may be integrated in the non-display area NDA. The data lines D1 to Dm of the display area DA may receive data signals (i.e., data voltages applied to pixels) from the data driver 460 which may be an integrated circuit (IC) chip mounted on a flexible printed circuit board (FPCB) 450 adhered to the display panel 300.

The gate driver 500 and the data driver 460 are controlled by the signal controller 600. A printed circuit board (PCB) 400 may be disposed outside the FPCB 450 to transfer signals from the signal controller 600 to the data driver 460 and the gate driver 500. Signals to be supplied from the signal controller 600 to the gate driver 500 are transferred to the gate driver 500 through a driver control signal line DCL disposed in the display panel 300. The signals to be supplied from the signal controller 600 to the gate driver 500 through the driver control signal line DCL may include signals, such as vertical start signals and clock signals, and signals for supplying a low voltage of a specific level. Some signals may be supplied from another device instead of the signal controller 600.

For example, the driver control signal line DCL may be connected with the PFCB 450 close to the gate driver 500, and may extend in a direction in which the gate driver 500 extends. The driver control signal line DCL may extend in parallel with the gate driver 500 in the non-display area NDA, for example. Although the driver control signal line DCL is illustrated as one line in FIG. 1 in order to avoid complication of the drawing, the driver control signal line DCL may include a plurality of driver control signal lines, the number of which corresponds to types of signals transferred to the gate driver 500, or may include more or fewer signal lines. The signal lines of the DCL may be disposed in parallel with the gate driver 500 at a more external portion from the display area DA than the gate driver 500, but the inventive concepts are not limited thereto. For example, some signal lines may be disposed between the gate driver 500 and the display area DA, and some signal lines may be disposed through the gate driver 500.

The gate driver 500 receives a low voltage corresponding to the vertical start signal, the clock signal, and the gate-off voltage through the driver control signal line DCL to generate gate signals (gate-on voltage and gate-off voltage), and applies them to the gate lines G1 to Gn. The gate driver 500 includes stages ST1 to STn for generating and outputting gate signals using these signals. One of the stages ST1 to STn is connected to two of the gate lines G1 to Gn. Thus, each stage outputs a gate signal to two gate lines. Although it is described in the present exemplary embodiment that two gate lines are connected to one stage, the inventive concepts are not limited thereto, and three or more gate lines may be connected to one stage.

The gate driver 500 may be disposed at a left and/or right side of the display area DA, and may be disposed at an upper side and/or lower side thereof. When the gate driver 500 is disposed at the left and right sides of the display panel, the gate driver disposed at the left side of the display panel may include odd-numbered stages ST1, ST3, . . . , and the gate driver disposed at the right side of the display panel may include even-numbered stages ST2, ST4, . . . , or vice versa. However, although the gate driver 500 is disposed at the left and right sides of the display panel, each gate driver may include all the stages ST1 to STn.

Each stage includes transistors and at least one capacitor. Each stage may be substantially rectangular, and all of the stages ST1 to STn may have substantially the same size (area) as each other. In other words, the size of a region where the transistors and the capacitors constituting each stage are formed may be the same between the stages ST1 through STn in the display panel 300, and such a region may be substantially rectangular. For example, the stages ST2, ST3, . . . ST(n−1) disposed between the first stage ST1 and the $n^{th}$ stage STn may be disposed in substantially the same rectangular area. Therefore, each of the stages is illustrated as a rectangular block having the same area and shape in FIG. 1.

Figure 2:
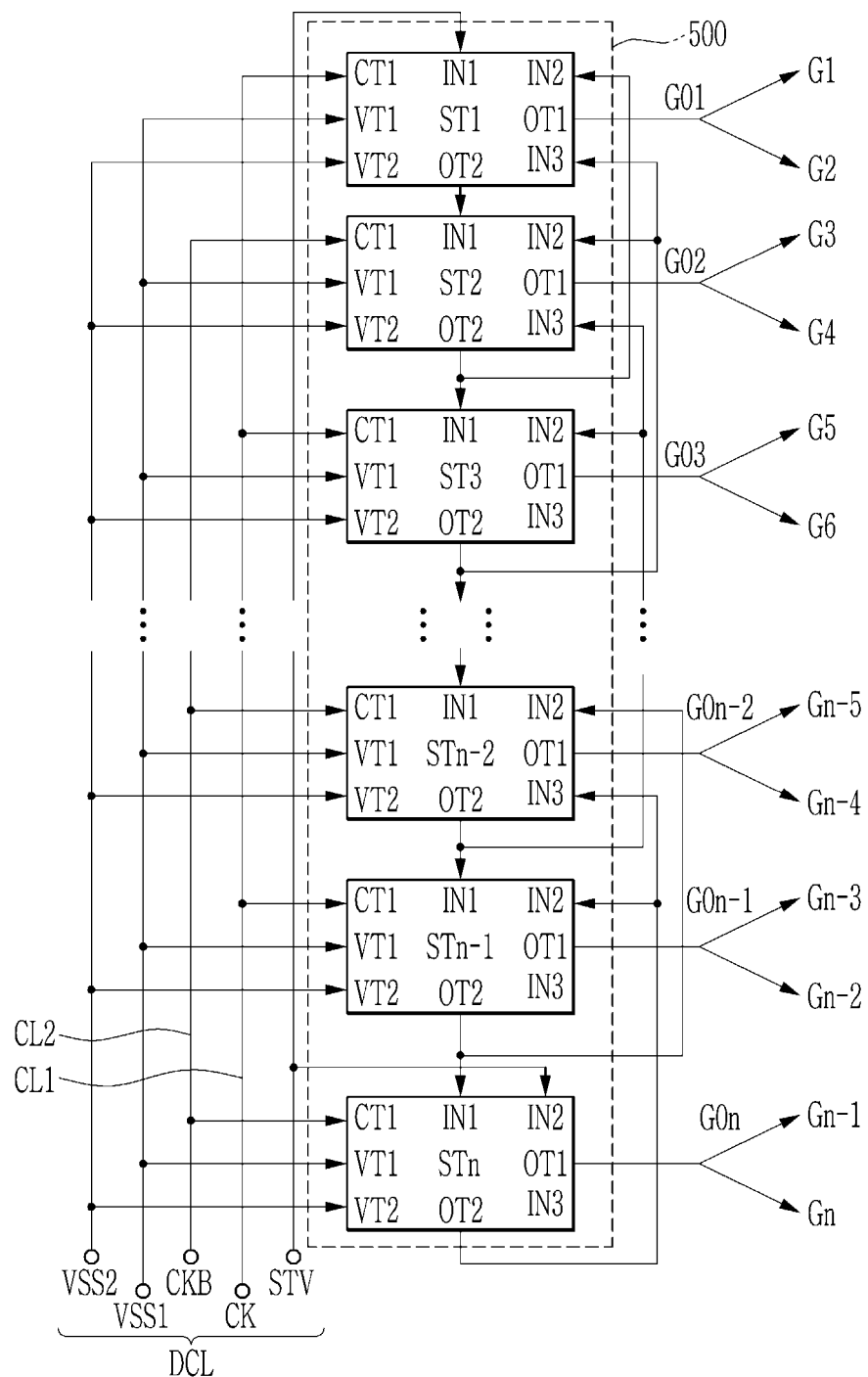
FIG. 2 is a block diagram illustrating a gate driver of FIG. 1 and signals inputted thereto and outputted therefrom.

FIG. 2 is a block diagram illustrating a gate driver of FIG. 1 and signals inputted thereto and outputted therefrom.

Referring to FIG. 2, the gate driver 500 includes a shift register including stages ST1 to STn that are dependently connected with each other. Each of the first to $n^{th}$ stages ST1 to STn is connected with two of the first to $n^{th}$ gate lines G1 to Gn. For example, the first stage ST1 is connected with the first gate line G1 and the second gate line G2, and the second stage ST2 is connected with the third gate line G3 and the fourth gate line G4. In the case of the stages ST1 to STn, the first stage ST1 to the $n^{th}$ stage STn may sequentially output n gate signals to the gate lines G1 to Gn, or the $n^{th}$ stage STn to the first stage ST1 may sequentially output the gate signals.

Each stage includes a first clock terminal CT1, a first input terminal IN1, a second input terminal IN2, a third input terminal IN3, a first voltage terminal VT1, a second voltage terminal VT2, a first output terminal OT1, and a second output terminal OT2.

The first clock terminal CT1 may receive a first clock signal CK or a second clock signal CKB obtained by inverting a phase of the first clock signal CK. For example, the first clock terminal CT1 of each of the odd-numbered stages ST1, ST3, . . . may receive the first clock signal CK, and the first clock terminal CT1 of each of the even-numbered stages ST2, ST4, . . . may receive the second clock signal CKB. The first clock signal CK and the second clock signal CKB may be generated by using a combination of a high signal and a low signal, and a duty ratio thereof may be 50%. These clock signals CK and CKB may be transmitted through the first clock signal line CL1 and the second clock signal line CL2 of the driver control signal line DCL.

The first input terminal IN1 may be connected to the second output terminal OT2 of a previous stage to receive a carry signal. The first stage ST1 may receive a vertical start signal STV through the first input terminal IN1 since the previous stage does not exist.

The second input terminal IN2 may be connected to the second output terminal OT2 of a subsequent stage to receive the carry signal. The $n^{th}$ stage, which is a last stage, has no subsequent stage, and thus, may receive a vertical start signal STV through the second input terminal IN2. The third input terminal IN3 may be connected to the second output terminal OT2 of a next stage but one to receive the carry signal.

Unlike the illustrated exemplary embodiment, the gate driver 500 may further include two dummy stages (not illustrated) in order for the $(n-1)^{th}$ stage ST(n−1) and the $n^{th}$ stage STn to receive carry signals from a subsequent stage and a next stage but one. Unlike the stages ST1 to STn, the dummy stage serves to generate and output a dummy gate voltage. Specifically, as gate signals outputted from the stages ST1 to STn are transferred through the gate lines G1 to Gn, a data voltage is applied to the pixels to display an image. However, the dummy stage may not be connected to the gate line, or may be connected to a gate line of a dummy pixel by which no image is displayed.

The first voltage terminal VT1 may receive a first low voltage VSS1. The first low voltage VSS1 has a first low level that can correspond to a discharge level of the gate signal. For example, the first low level may be about −6 V.

The second voltage terminal VT2 may receive a second low voltage VSS2 having the second low level that is lower than the first low level. The second low level corresponds to the discharge level of the first contact Q included in the stage. For example, the second low level may be about −10 V.

The first output terminal OT1 is electrically connected to corresponding gate lines, e.g., the first gate line G1 and the second gate line G2, to output gate signals. The first output terminals OT1 of the first stage to $n^{th}$ stages ST1 to STn respectively output first to $n^{th}$ gate signals GO1 to GOn. For example, the first output terminal OT1 of the first stage ST1 is electrically connected to the first gate line G1 and the second gate line G2 to output the first gate signal GO1, and the first output terminal OT1 of the second stage ST2 is electrically connected to the third gate line G3 and the fourth gate line G4 to output the second gate signal GO2. The first gate signal GO1 is outputted first, and then the second gate signal GO2 is outputted. Then, the third gate signal GO3 to the $n^{th}$ gate signal GOn may be sequentially outputted.

The second output terminal OT2 may output a carry signal. The second output terminal OT2 of the $(n-1)^{th}$ stage ST(n−1) may be connected with the first input terminal IN1 of an $n^{th}$ stage STn and the second input terminal IN2 of an $(n-2)^{th}$ stage ST(n−2). The second output terminal OT2 of the $n^{th}$ stage STn may be connected with the second input terminal IN2 of an $(n-1)^{th}$ stage ST(n−1) and the third input terminal IN3 of an $(n-2)^{th}$ stage ST(n−2).

The connection structure of the stages ST1 to STn of the gate driver 500 had been described with reference to FIG. 2. Hereinafter, a structure of one stage connected to two gate lines will be described in more detail with reference to FIG. 3.

Figure 3:
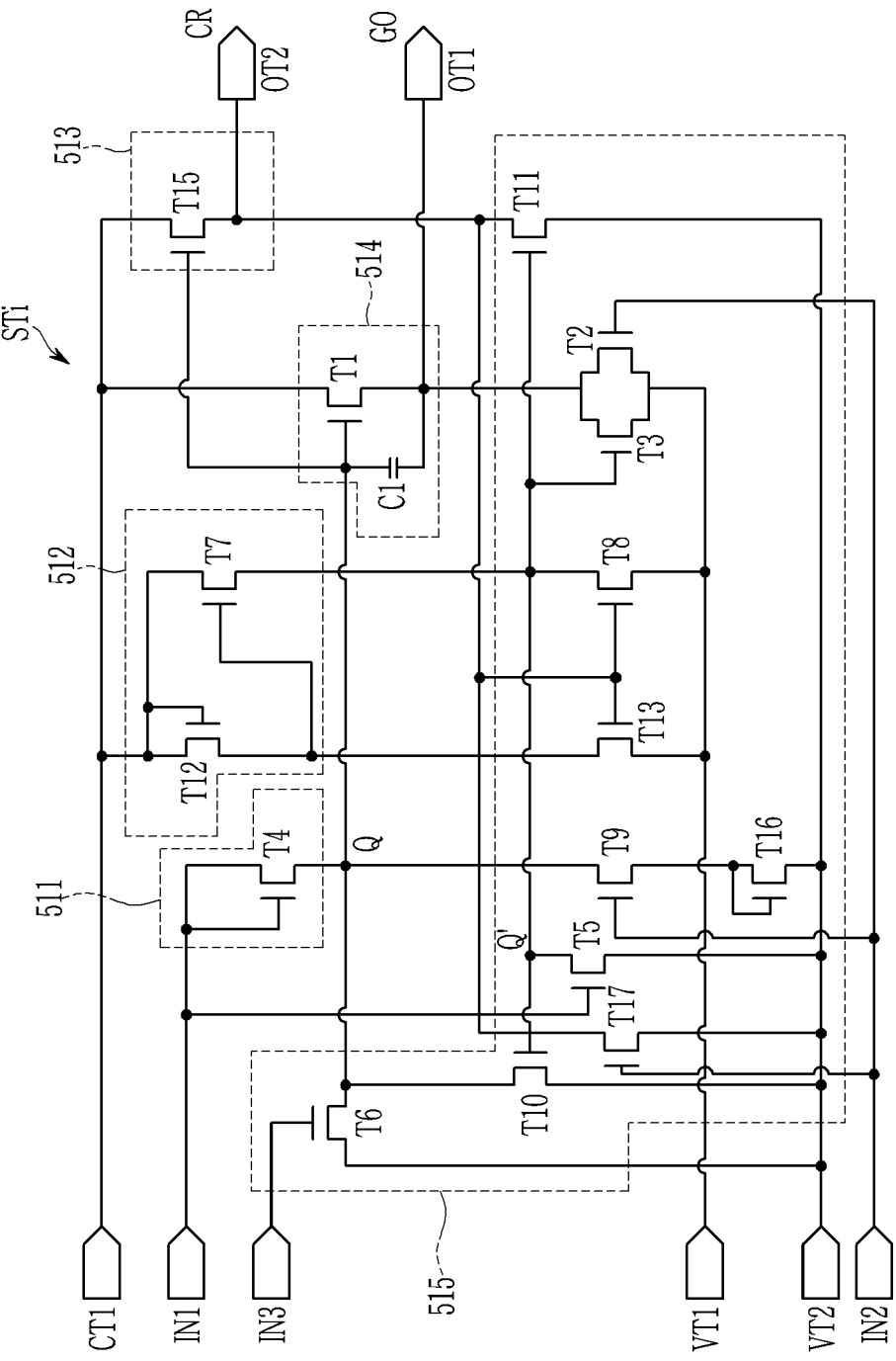
FIG. 3 illustrates an example of a stage of a gate driver according to an exemplary embodiment of the invention.

FIG. 3 illustrates an example of a stage of a gate driver according to an exemplary embodiment of the invention gate driver.

Referring to FIG. 3, the stage Sti according to an exemplary embodiment includes an input section 511, a pull-up driver 512, a carry signal generator 513, an output section 514, and a pull-down driver 515.

The input section 511 includes a fourth transistor T4. A first electrode and a control electrode of the fourth transistor T4 are commonly connected (diode connected) to the first input terminal IN1, and a second electrode thereof is connected with a first contact Q. The input section 511 serves to transfer a carry signal CR of the previous stage ST(i−1) to the first contact Q through the first input terminal IN1. The input section 511 may also be referred to as a buffer unit.

The pull-up driver 512 includes a seventh transistor T7 and a twelfth transistor T12. A control electrode and a first electrode of the twelfth transistor T12 are commonly connected to receive a first clock signal CK or a second clock signal CKB through the first clock terminal CT1, and a second electrode thereof is connected with a control electrode of the seventh transistor T7 and the pull-down driver 515. A first electrode of the seventh transistor T7 is connected with the first clock terminal CT1, a second electrode thereof is connected with a second contact Q' and the pull-down driver 515, and the control electrode thereof is connected with the second electrode of the twelfth transistor T12 and the pull-down driver 515. A parasitic capacitor may be formed between the first electrode and the control electrode of the seventh transistor T7 and between the control electrode and the second electrode thereof, respectively. When a high signal is applied to the first clock terminal CT1, the high signal is transferred to the control electrode of the seventh transistor T7 and the pull-down driver 515. The high signal transferred to the seventh transistor T7 turns on the seventh transistor T7. As a result, the high signal applied from the first clock terminal CT1 is applied to a second contact Q'. A signal of the second contact Q' may be an inverter signal IVT, and may be transferred to a subsequent stage ST(i+1) through a third output terminal (not illustrated). In the meantime, the inverter signal IVT of the previous stage ST(i−1) may have a requirement of an output control signal.

The carry signal generator 513 includes a fifteenth transistor T15. The first clock terminal CT1 is connected to a first electrode of the fifteenth transistor T15 to input a first clock signal CK or a second clock signal CKB into the first electrode of the fifteenth transistor T15, a control electrode thereof is connected with the first contact Q as an output of the input section 511, and a second electrode thereof is connected with the second output terminal OT2 which outputs the carry signal CR. A parasitic capacitor may be formed between the control electrode and the second electrode of the fifteenth transistor T15. The second electrode of the fifteenth transistor T15 is connected to the pull-down driver 515 as well as the second output terminal OT2 to receive a second low voltage VSS2. As a result, a voltage when the carry signal CR is low has the second low voltage VSS2.

The output section 514 includes a first transistor T1 and a first capacitor C1. A control electrode of the first transistor T1 is connected with the first contact Q, a first electrode thereof receives the first clock signal CK or the second clock signal CKB through the first clock terminal CT1, and a second electrode thereof is connected with the first output terminal OT1 which outputs a gate signal GO. A first capacitor C1 may be formed between the control electrode and the second electrode of the first transistor T1 to serve to store a voltage of the first contact Q. The output section 514 outputs the gate signal GO according to the voltage at the first contact Q and the clock signals CK and CKB. For example, the clock signal is changed from low to high through the first clock terminal CT1 during a OH period in a state (precharge) in which a high voltage is stored in the first capacitor C1 by applying the carry signal CR of the previous stage ST(i−1) to the first contact Q during a −1H period in the stage Sti. The second electrode of the first transistor T1 is also connected with the pull-down driver 515 to receive the first low voltage VSS1. As a result, a gate-off voltage of the gate signal GO has a first low voltage VSS1.

The pull-down driver 515 for smoothly outputting a gate-off voltage and a low voltage of the carry signal CR by removing charges existing on the stage Sti serves to reduce a potential of the first contact Q, a potential of the second contact Q' (inverter signal), a voltage outputted as the carry signal CR, and a voltage outputted to the gate line. The pull-down driver 515 reduces the first output terminal OT1 to the first low voltage VS Si, and the first contact Q, the second contact Q', and the second output terminal OT2 to the second low voltage VSS2 that is lower than the first low voltage VSS1. As a result, although the gate-on voltage and a voltage when the carry signal CR is high may be a same voltage, the gate-off voltage and a voltage when the carry signal CR is low may be different voltages. The pull-down driver 515 may include a second transistor T2, a third transistor T3, a fifth transistor T5, a sixth transistor T6, an eighth transistor T8, a ninth transistor T9, a tenth transistor T10, an eleventh transistor T11, a thirteenth transistor T13, a sixteenth transistor T16, and a seventeenth transistor T17.

First, a transistor for pulling down the first contact Q will be described. The transistor for pulling down the first contact Q includes the sixth transistor T6, the ninth transistor T9, the tenth transistor T10, and the sixteenth transistor T16.

A control electrode of the sixth transistor T6 is connected with the third input terminal IN3 to receive the carry signal CR of the next stage ST(i+2), a second electrode thereof is connected with the second voltage terminal VT2 to receive the second low voltage VSS2, and a first electrode thereof is connected with the first contact Q. The sixth transistor T6 is turned on according to the carry signal CR applied from the next stage ST(i+2) to serve to reduce the voltage of the first contact Q to the second low voltage VSS2.

The ninth transistor T9 and the sixteenth transistor T16 operate together to pull down the first contact Q. A control electrode of the ninth transistor T9 is connected with the second input terminal IN2 to receive the carry signal CR of the subsequent stage ST(i+1), and a second electrode thereof is connected with a first electrode and a control electrode of the sixteenth transistor T16. A control electrode and a first electrode of the sixteenth transistor T16 are connected (diode connected) to the second electrode of the ninth transistor T9, and a second electrode thereof is connected with the second voltage terminal VT2 to receive the second low voltage VSS2. The ninth transistor T9 and the sixteenth transistor T16 are turned on according to the carry signal CR applied from the subsequent stage ST(i+1) to serve to reduce the voltage of the first contact Q to the second low voltage VSS2.

A first electrode of the tenth transistor T10 is connected with the first contact Q, a second electrode thereof is connected with the second voltage terminal VT2 to receive the second low voltage VSS2, and a control electrode thereof is connected with the second contact Q' to receive the inverter signal IVT of the present stage. Accordingly, the tenth transistor T10 serves to continuously reduce the voltage of the first contact Q to the second low voltage VSS2 in a general section in which the inverter signal IVT of the second contact Q' has a high voltage, but stops reducing the voltage of the first contact Q only when the voltage of the second contact Q' is low. When the voltage of the first contact Q is not reduced, the corresponding stage STi outputs the gate-on voltage and the carry signal CR. The tenth transistor T10 serves to hold and stabilize the voltage of the first contact Q to the second low voltage VSS2, and may be referred to as a hold transistor.

Transistors for pulling down the second contact Q' (inverter signal) in the pull-down driver 515 will now be described. The transistors for pulling down the second contact Q' include a fifth transistor T5, an eighth transistor T8, and a thirteenth transistor T13.

A control electrode of the fifth transistor T5 is connected with the first input terminal IN1, a first electrode thereof is connected with the second contact Q', and a second electrode thereof is connected with the second voltage terminal VT2. The fifth transistor T5 serves to reduce the voltage of the second contact Q' to the second low voltage VSS2 according to the carry signal CR of the previous stage ST(i−1).

The eighth transistor T8 has a control electrode connected to the second output terminal OT2, a first electrode connected with the second contact Q', and a second electrode of the first voltage terminal VT1. The eighth transistor T8 serves to reduce the voltage of the second contact Q' to the first low voltage VSS1 according to the carry signal CR of the present stage STi.

The thirteenth transistor T13 has a control electrode connected to the second output terminal OT2, a first electrode connected to the second electrode of the twelfth transistor T12 of the pull-up driver 512, and a second electrode connected to the first voltage terminal VT1. The thirteenth transistor T13 serves to reduce an internal potential of the pull-up driver 512 to the first low voltage VSS1, and reduce the voltage of the second contact Q' connected to the pull-up driver 512 to the first low voltage VSS1.

Transistors that serve to reduce a voltage outputted as the carry signal CR in the pull-down driver 515 will now be described. Such transistors include an eleventh transistor T11 and a seventeenth transistor T17.

The eleventh transistor T11 has a control electrode connected with the second contact Q', a first electrode connected with the second output terminal OT2, and a second electrode connected with the second voltage terminal VT2. The eleventh transistor T11 reduces the voltage of the second output terminal OT2 to the second low voltage VSS2 when the voltage of the second contact Q' is high. As a result, the carry signal CR is changed to a low level. The eleventh transistor T11 serves to hold the voltage of the second output terminal OT2 to the second low voltage VSS2, and may be referred to as a hold transistor.

The seventeenth transistor T17 has a control electrode connected to the second input terminal IN2, a first electrode connected to the second output terminal OT2, and a second electrode connected to the second voltage terminal VT2. The seventeenth transistor T17 serves to reduce the voltage of the second output terminal OT2 according to the carry signal CR of the subsequent stage ST(i+1) to the second low voltage VSS2. The seventeenth transistor T17 is formed to operate based on the carry signal CR of the subsequent stage ST(i+1) in order to assist the operation of the eleventh transistor T11.

A second transistor T2 and a third transistor T3 serve to reduce a voltage outputted to the gate line in the pull-down driver 515.

The second transistor T2 has a control electrode connected to the second input terminal IN2, a first electrode connected with the first output terminal OT1, and a second electrode connected with the first voltage terminal VT1. The second transistor T2 serves to reduce the gate signal GO to the first low voltage VSS1 when the carry signal CR of the subsequent stage ST(i+1) is applied.

The third transistor T3 has a control electrode connected to the second contact Q', a first electrode connected to the first output terminal OT1, and a second electrode connected to the first voltage terminal VT1. The third transistor T3 serves to hold the gate signal to the first low voltage VSS1 when the voltage of the second contact Q' is high, and may be referred to as a hold transistor.

In the pull-down driver 515, the third transistor T3, the tenth transistor T10, and the eleventh transistor T11 are the hold transistors for stabilizing the voltages of the output terminals OT1 and OT2 and the first contact Q to secure driving reliability.

Hereinafter, a structure in which two gate lines are connected to one stage will be described in detail with reference to FIG. 4 and FIG. 5.

Figure 4:
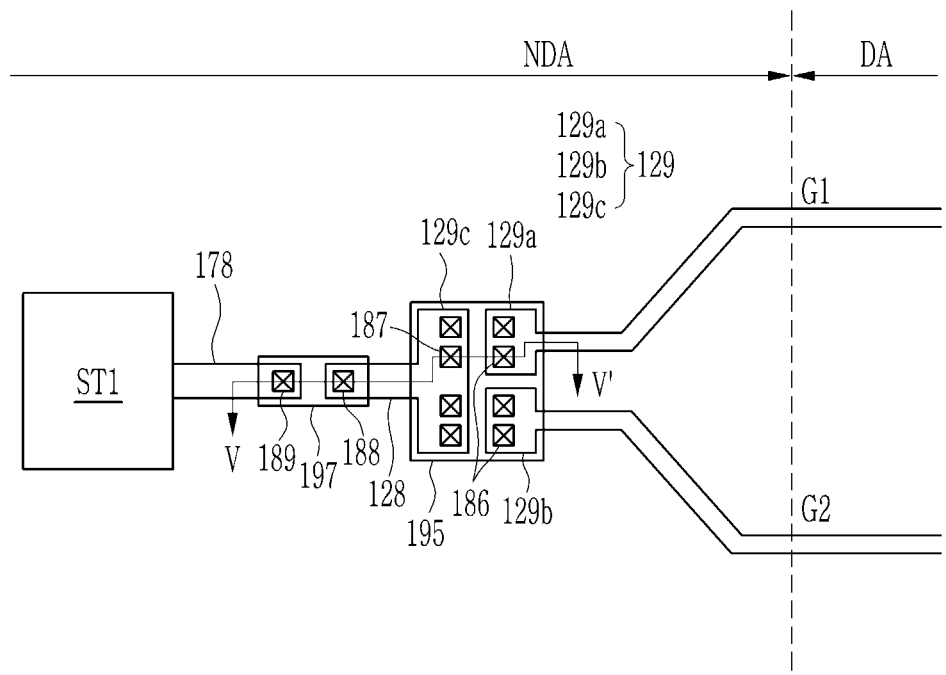
FIG. 4 is an enlarged view schematically illustrating a structure in which one stage is connected with two gate lines in the display device of FIG. 1.

FIG. 4 is an enlarged view schematically illustrating a structure in which one stage is connected with two gate lines in the display device of FIG. 1. FIG. 5 schematically illustrates an example of a cross-section taken along a line V-V' of FIG. 4. In FIG. 4, a connection structure between a stage ST1 and gate lines G1 and G2 are illustrated. Hereinafter, the stage ST1 is referred to as first stage ST1, and the gate lines G1 and G2 are referred to as first and second gate lines G1 and G2, respectively.

Figure 5:
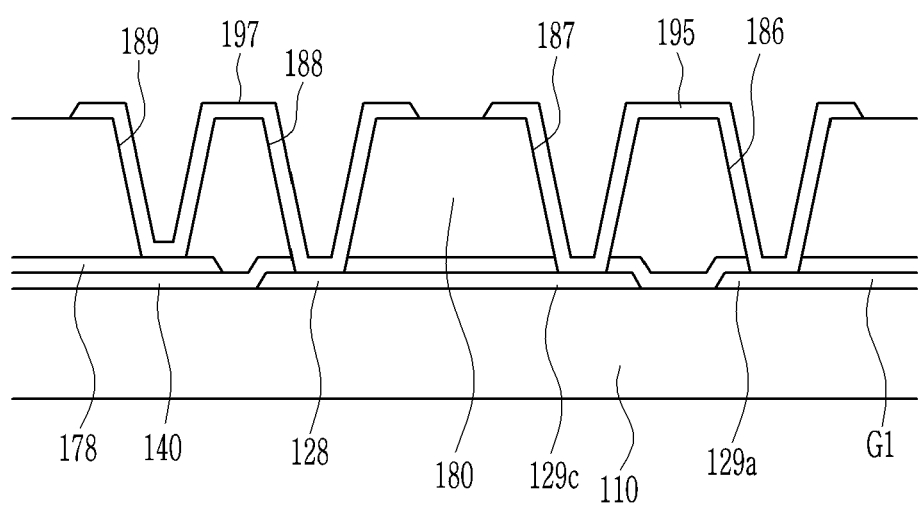
FIG. 5 schematically illustrates an example of a cross-section taken along a line V-V' of FIG. 4.

Referring to FIG. 4 and FIG. 5, the first stage ST1 is connected with the first gate line G1 and the second gate line G2 through a gate pad 129.

The gate pad 129 includes a first gate pad 129a, a second gate pad 129b, and a third gate pad 129c which are separated from each other. The first gate pad 129a is connected with the first gate line G1, and the second gate pad 129b is connected with the second gate line G2. The third gate pad 129c includes a gate pad extension 128 which extends in a direction of the first stage ST1.

The first gate pad 129a, the second gate pad 129b, and the third gate pad 129c are connected with each other through a gate pad connecting member 195. The gate pad extension 128 is connected with a stage connection line 178 connected with the first stage ST1 through a stage connecting member 197.

The first gate pad 129a, the third gate pad 129c, and the first gate line G1 are disposed on the substrate 110. Although not illustrated in the cross-section, the second gate pad 129b and the second gate line G2 are also disposed on the substrate 110. In other words, the first gate line G1, the second gate line G2, the first gate pad 129a, the second gate pad 129b, and the third gate pad 129c may include the same material, and may be formed by using the same process.

A gate insulating layer 140 is disposed on the first gate pad 129a and the third gate pad 129c, and the stage connection line 178 is disposed on the gate insulating layer 140. A passivation layer 180 is disposed on the stage connection line 178 and the gate insulating layer 140, and the gate pad connecting member 195 and the stage connecting member 197 are disposed on the passivation layer 180.

A pad first contact hole 186, a pad second contact hole 187, a stage first contact hole 188, and a stage second contact hole 189 are disposed in the passivation layer 180. The pad first contact hole 186 overlaps the first gate pad 129a and the second gate pad 129b, and the pad second contact hole 187 overlaps the third gate pad 129c. The stage first contact hole 188 overlaps the gate pad extension 128, and the stage second contact hole 189 overlaps the stage connection line 178.

The gate pad connecting member 195 connects the first gate pad 129a and the third gate pad 129c through the pad first contact hole 186 and the pad second contact hole 187. The gate pad connecting member 195 also connects the second gate pad 129b and the third gate pad 129c through the pad first contact hole 186 and the pad second contact hole 187. In addition, the gate pad connecting member 195 connects the first gate pad 129a and second gate pad 129b through the pad first contact hole 186. As a result, the first gate pad 129a, the second gate pad 129b, and the third gate pad 129c are connected with each other through the gate pad connecting member 195.

The stage connecting member 197 connects the gate pad extension 128 and the stage connection line 178 through the stage first contact hole 188 and the stage second contact hole 189.

Accordingly, the first stage ST1 is connected with the first gate line G1 and the second gate line G2 through the gate pad 129.

Hereinafter, an arrangement of pixels disposed in the display area DA in the display device of FIG. 1 will be described with reference to FIG. 6 and FIG. 7.

Figure 6:
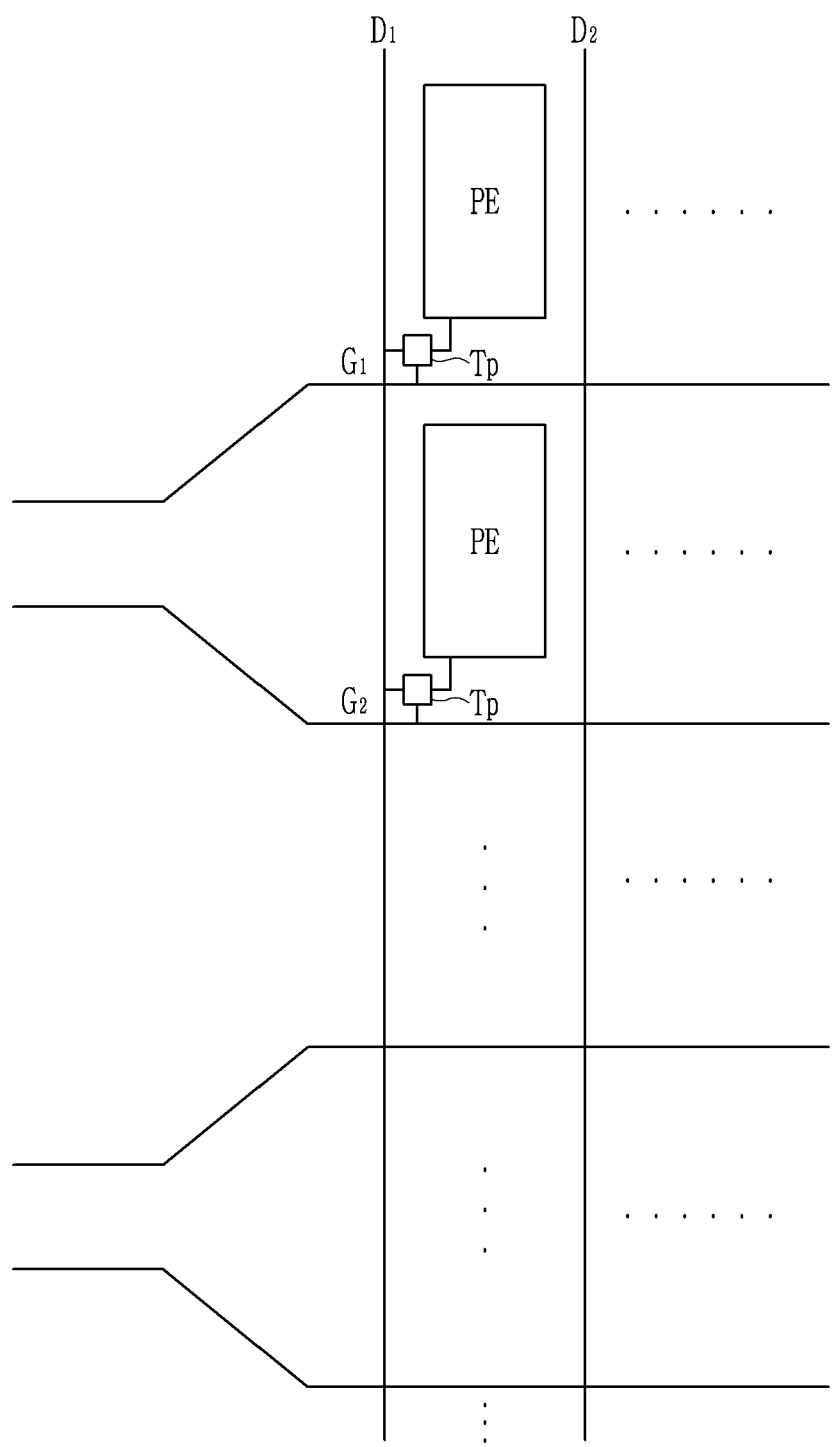
FIG. 6 schematically illustrates an example of pixel arrangement of the display device according to the exemplary embodiment of FIG. 1.

FIG. 6 schematically illustrates an example of pixel arrangement of the display device according to the exemplary embodiment of FIG. 1. FIG. 7 schematically illustrates an example of a cross-section of a pixel of the display device according to the exemplary embodiment of FIG. 1.

Figure 7:
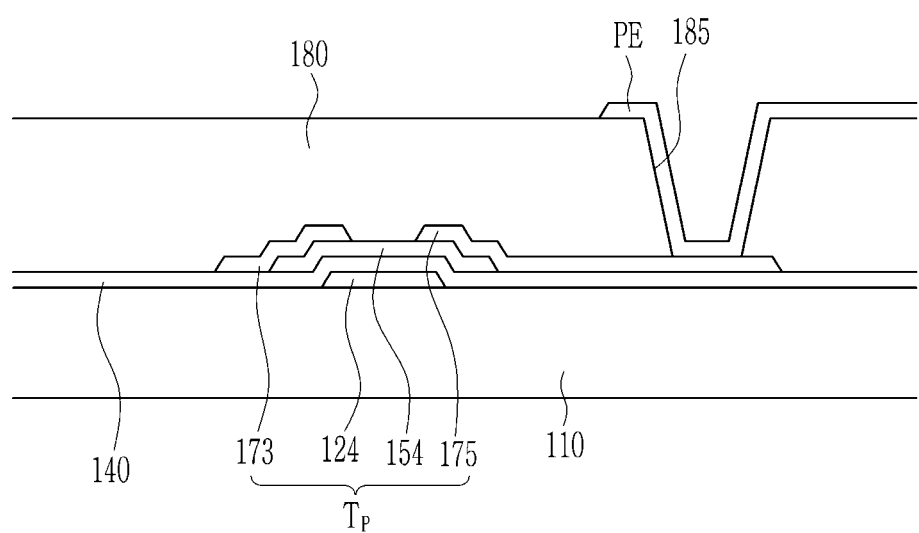
FIG. 7 schematically illustrates an example of a cross-section of a pixel of the display device according to the exemplary embodiment of FIG. 1.

Referring to FIG. 6 to FIG. 7, the gate lines G1 and G2 extend in a horizontal direction, and the data lines D1 and D2 extend in a vertical direction to cross the gate lines G1 and G2.

Each pixel includes a pixel transistor Tp connected with one gate line and one data line, and a pixel electrode PE connected with the pixel transistor Tp. In the case of a pixel disposed at a first column and a first row in the drawing, the pixel transistor Tp is connected with the first gate line G1 and first data line D1. In the case of a pixel disposed at the first column and a second row, the pixel transistor Tp is connected with the second gate line G2 and the first data line D1. That is, in the case of pixels disposed at a same column, the pixel transistor Tp is connected to a same data line. Herein, the pixel transistor Tp may be formed in the same process as a plurality of transistors included in the gate driver 500.

A gate electrode 124 is disposed on the substrate 110, and the gate insulating layer 140 is disposed on the substrate 110 and the gate electrode 124. A semiconductor layer 154 is disposed on the gate insulating layer 140 to overlap the gate electrode 124, and a source electrode 173 and a drain electrode 175 are disposed on the semiconductor layer 154 and the gate insulating layer 140. The source electrode 173 is separated from the drain electrode 175.

Herein, the gate electrode 124, the source electrode 173, the drain electrode 175, and the semiconductor layer 154 constitute the pixel transistor Tp, and a channel of the pixel transistor Tp is disposed on the semiconductor layer 154 between the source electrode 173 and the drain electrode 175 which are separated from each other. In addition, the gate electrode 124 serves as a control electrode of the transistor Tp, the source electrode 173 serves as a first electrode of the transistor Tp, and the drain electrode 175 serves as a second electrode of the transistor Tp. The gate electrode 124 is connected with the gate line, and the source electrode 173 is connected with the data line. Although not illustrated, the gate line is disposed at a same layer as the gate electrode 124, and the data line is disposed at a same layer as the source electrode 173.

The passivation layer 180 is disposed on the source electrode 173, the drain electrode 175, and the gate insulating layer 140, and a pixel electrode PE is disposed on the passivation layer 180. A drain contact hole 185 is disposed in the passivation layer 180 to overlap the drain electrode 175, and the pixel electrode PE is connected with the drain electrode 175 through the drain contact hole 185. The pixel electrode PE may include a vertical stem and a horizontal stem which cross each other, and a minute branch connected with the vertical stem and the horizontal stem.

Herein, the gate electrode 124 may include a same material as the gate pad 129 illustrated in FIG. 4, and may be formed by a same process. The source electrode 173 and the drain electrode 175 may include the same material as the stage connection line 178 illustrated in FIG. 4, and may be formed by the same process. The pixel electrode PE may include the same material as the gate pad connecting member 195 and the stage connecting member 197 illustrated in FIG. 4, and may be formed by the same process.

Hereinafter, a manufacturing method of a display device according to an exemplary embodiment of the invention will be described with reference to FIG. 4 to FIG. 7 as well as FIG. 8.

Figure 8:
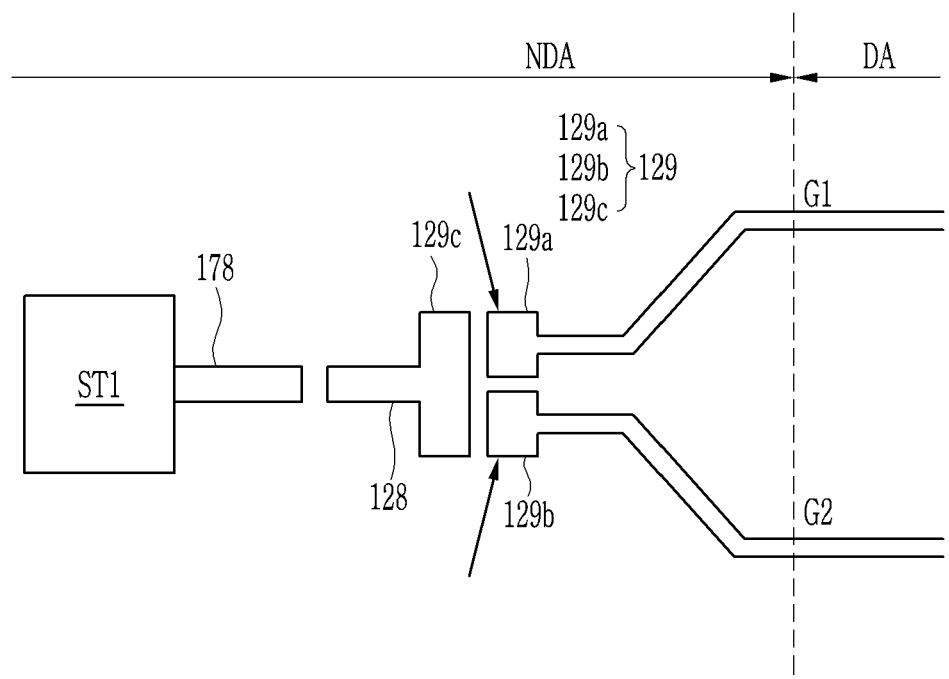
FIG. 8 schematically illustrates an example of a step of inspecting a gate line in a manufacturing process of a display device according to an exemplary embodiment of the invention.

FIG. 8 schematically illustrates an example of a step of inspecting a gate line in a manufacturing process of a display device according to an exemplary embodiment of the invention.

Referring to FIG. 8, a first gate line G1 and a second gate line G2 are inspected for defects through the first gate pad 129a and the second gate pad 129b.

Before the first gate line G1 and the second gate line G2 are inspected for defects, the gate electrode 124, the gate pad 129, the first gate line G1, and the second gate line G2 are disposed on the substrate 110, and then a gate insulating layer 140 is disposed on the gate electrode 124, the gate pad 129, the first gate line G1, the second gate line G2, and the substrate 110. Next, a semiconductor layer 154 is disposed on the gate insulating layer 140, and the source electrode 173, the drain electrode 175, the stage connection line 178, the first data line D1, and the second data line D2 are disposed on the gate insulating layer 140 and the semiconductor layer 154 (see FIG. 4 to FIG. 7).

Subsequently, as described above, the first gate line G1 and the second gate line G2 are inspected for defects through the first gate pad 129a and the second gate pad 129b (see FIG. 8).

In the conventional case, in a structure in which two gate lines are connected to one stage, even when one of the two gate lines fails at the time of inspecting the gate line, it may be difficult to detect the defect because the two gate lines are connected. In contrast, in the present exemplary embodiment, since the first gate line G1 and the second gate line G2 are inspected for defects through the first gate pad 129a and the second gate pad 129b that are separated from each other, defect detection of each gate line is easy.

Next, a passivation layer 180 is disposed on the source electrode 173, the drain electrode 175, the stage connection line 178, the first data line D1, the second data line D2, and the insulating layer 140, and a pixel electrode PE, a gate pad connecting member 195, and a stage connecting member 197 is disposed on the passivation layer 180 (see FIG. 4 to FIG. 7).

Herein, the passivation layer 180 has a drain contact hole 185 that overlaps the drain electrode 175, a pad first contact hole 186 that overlaps the first gate pad 129a and the second gate pad 129b, a pad second contact hole 187 that overlaps the third gate pad 129c, a stage first contact hole 188 that overlaps the gate pad extension 128, and a stage second contact hole 189 that overlaps the stage connection line 178.

The first gate pad 129a, the second gate pad 129b, and the third gate pad 129c are connected with each other through the gate pad connecting member 195.

Specifically, the gate pad connecting member 195 connects the first gate pad 129a and the third gate pad 129c through the pad first contact hole 186 and the pad second contact hole 187. The gate pad connecting member 195 also connects the second gate pad 129b and the third gate pad 129c through the pad first contact hole 186 and the pad second contact hole 187. In addition, the gate pad connecting member 195 connects the first gate pad 129a and the second gate pad 129b through the pad first contact hole 186.

The stage connecting member 197 connects the gate pad extension 128 and the stage connection line 178 through the stage first contact hole 188 and the stage second contact hole 189. The pixel electrode PE is connected with the drain electrode 175 through the drain contact hole 185.

It has been described in the present exemplary embodiment that the display device has an arrangement structure of pixels in which the pixel transistors Tp of pixels disposed in the same column are connected to the same data line, but the invention is not limited thereto. The display device may have various pixel arrangement structures. This will be described with reference to FIG. 9 to FIG. 11.

Figure 9:
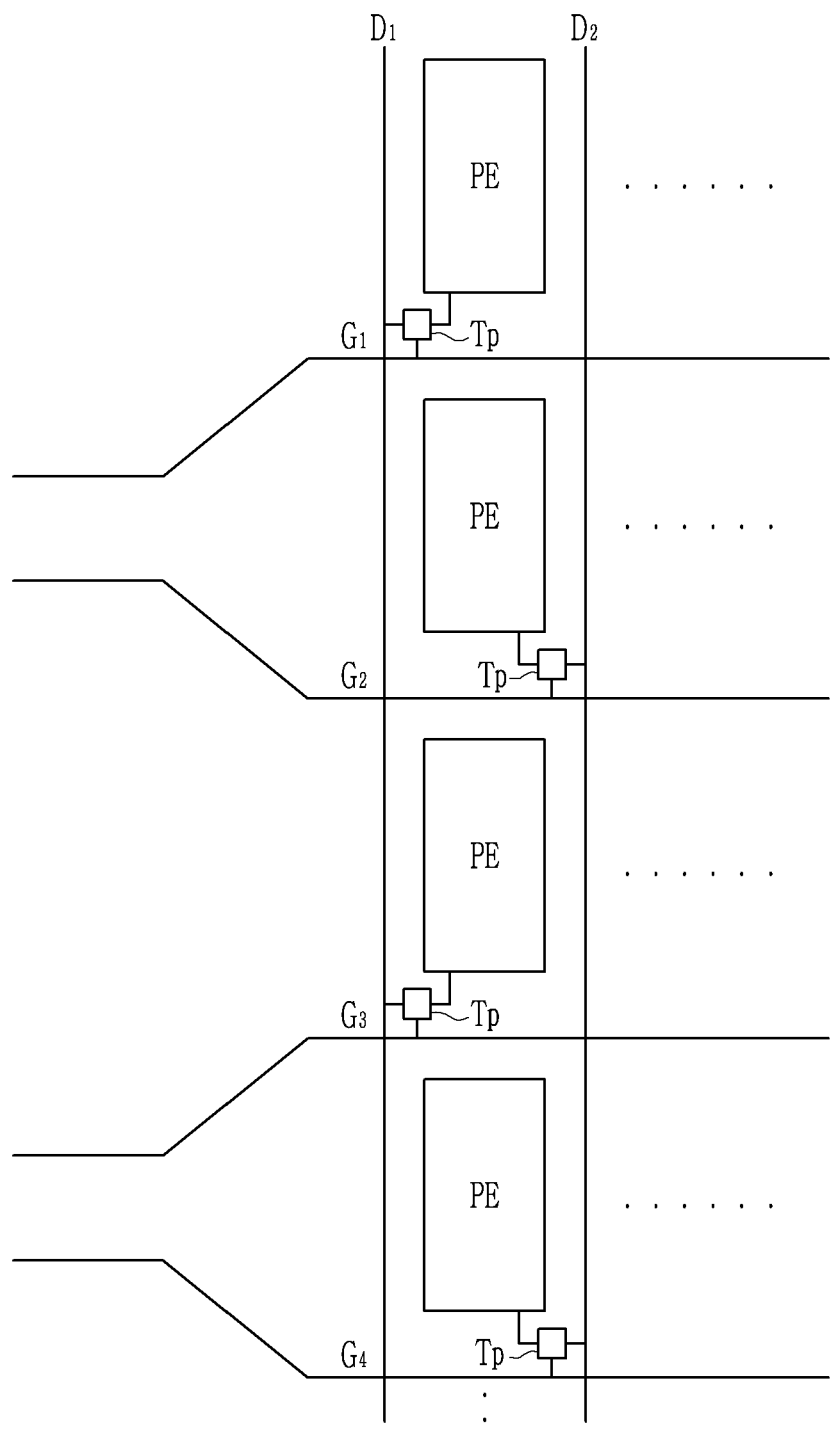
FIG. 9, FIG. 10, and FIG. 11 respectively schematically illustrate examples of pixel arrangement of a display device according to an exemplary embodiment of the invention.
Figure 10:
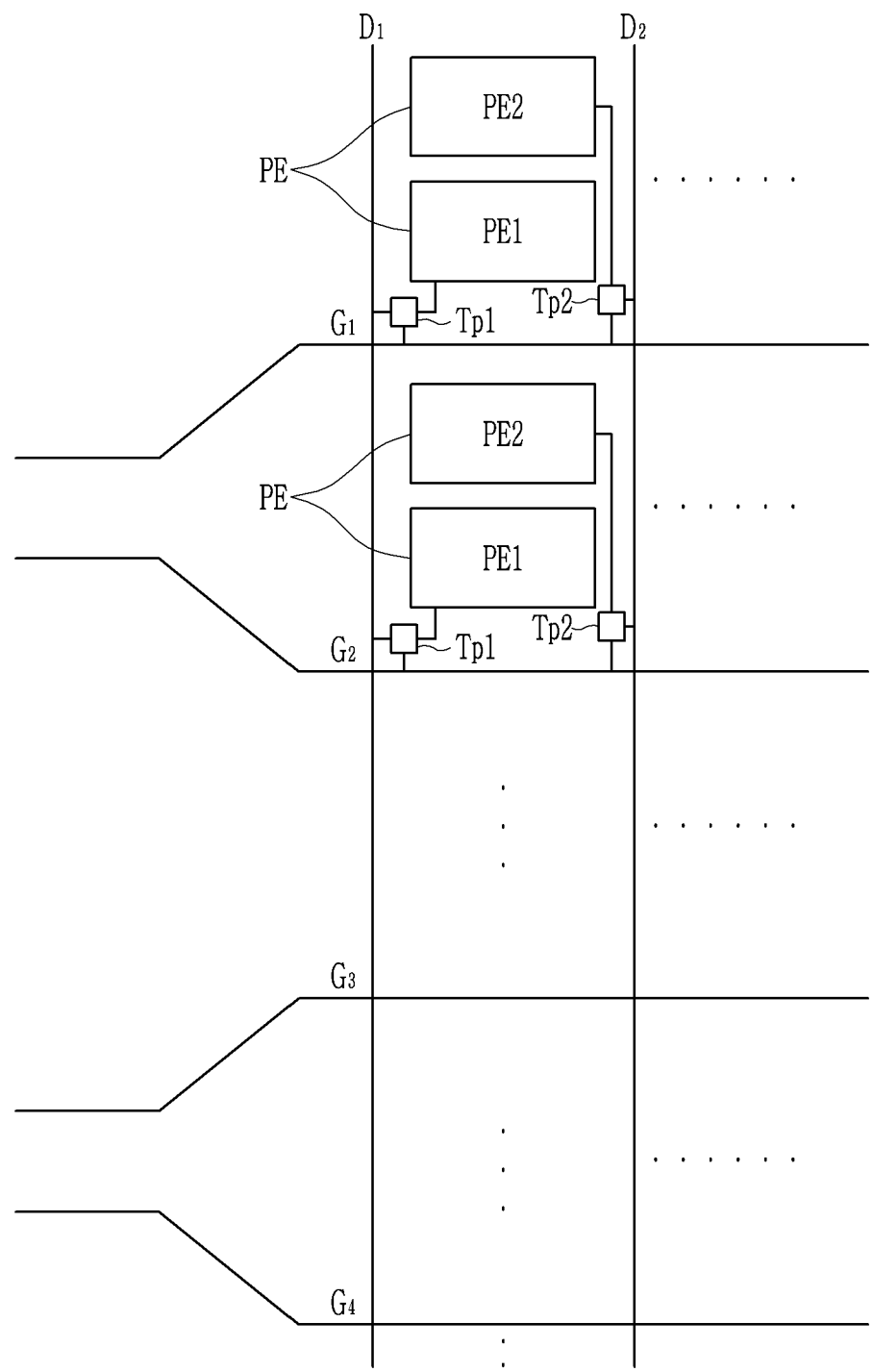
Figure 11:
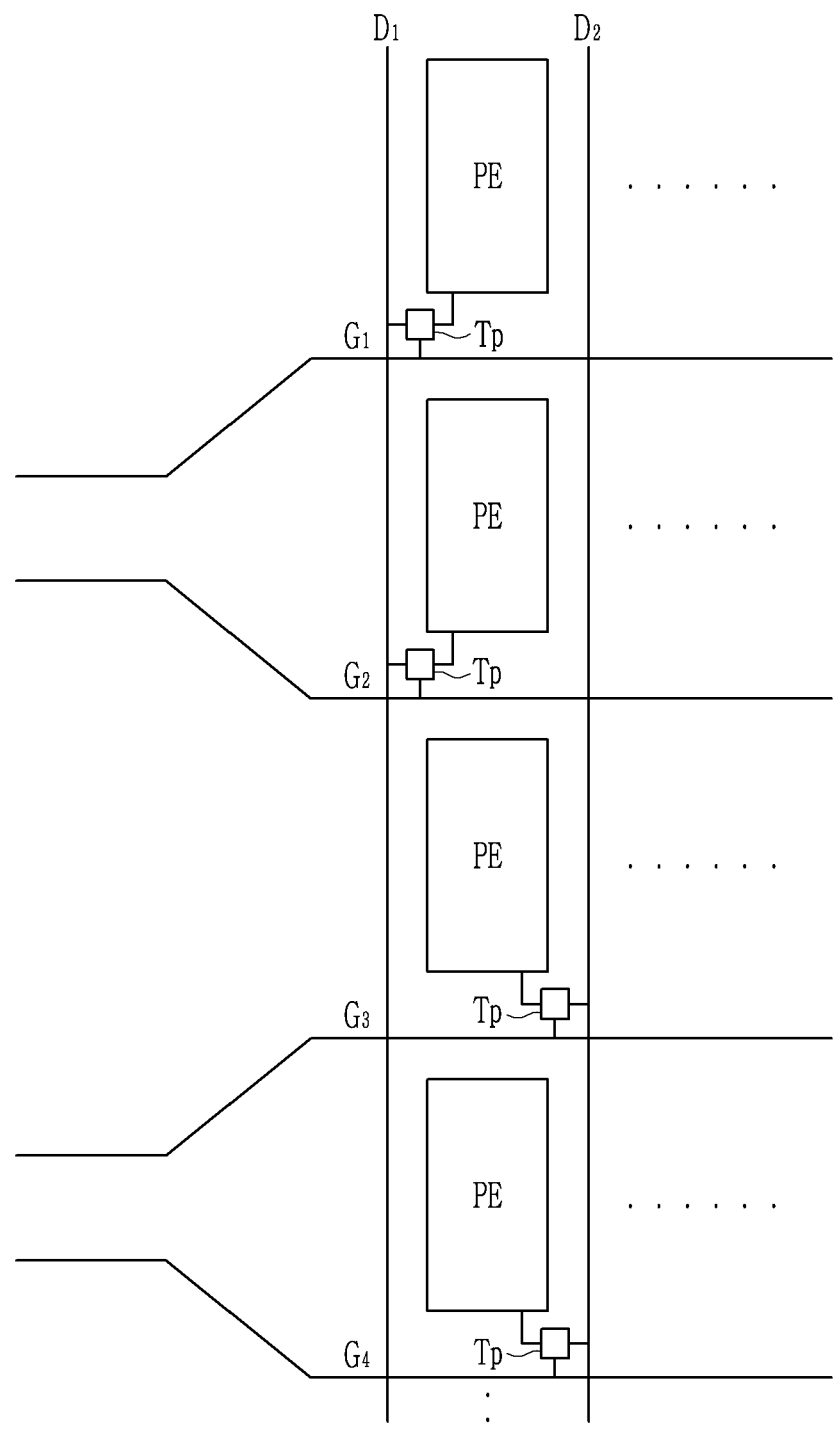

FIG. 9 to FIG. 11 respectively schematically illustrate examples of pixel arrangement of a display device according to an exemplary embodiment of the invention.

Referring to FIG. 9, in the display device according to the present exemplary embodiment, the transistors T of the pixels disposed in the same column are connected to different data lines D1 and D2.

Gate lines G1, G2, G3, and G4 extend in a horizontal direction, and the data lines D1 and D2 extend in a vertical direction to cross the gate lines G1, G2, G3, and G4. Each of the pixels includes one gate line, a pixel transistor Tp connected with the data line, and a pixel electrode PE connected with the pixel transistor Tp.

In the case of a pixel disposed at a first column and a first row on the drawing, the pixel transistor Tp is connected to the first gate line G1 and the first data line D1. In the case of a pixel disposed at the first column and a second row, the pixel transistor Tp is connected to the second gate line G2 and the second data line D2. In the case of a pixel disposed at the first column and a third row, the pixel transistor Tp is connected to the third gate line G3 and the first data line D1. In the case of a pixel disposed at the first column and a fourth row, the pixel transistor Tp is connected to the fourth gate line G4 and the second data line D2. As a result, the pixel transistors Tp of the pixels adjacent to each other in a column direction are connected to different data lines.

Referring to FIG. 10, in the display device according to the present exemplary embodiment, one pixel includes two subpixel electrodes PE1 and PE2, and pixel transistors Tp1 and Tp2 connected to the two subpixel electrodes PE1 and PE2 are connected to different data lines D1 and D2. The two subpixel electrode PE1 and PE2 may include a vertical stem and a horizontal stem which cross each other, and a minute branch connected with the vertical stem and the horizontal stem.

Gate lines G1, G2, G3, and G4 extend in a horizontal direction, and the data lines D1 and D2 extend in a vertical direction to cross the gate lines G1, G2, G3, and G4. Each of the pixels includes a pixel electrode PE including a first subpixel electrode PE1 and a second subpixel electrode PE2, a first pixel transistor Tp1 connected to the first subpixel electrode PE1, and a second pixel transistor Tp2 connected to the second subpixel electrode PE2.

The first subpixel electrode PE1 and the second subpixel electrode PE2 are separated from each other, the first pixel transistor Tp1 is connected to the first gate line G1 and the first data line D1, and the second pixel transistor Tp2 is connected to the first gate line G1 and the second data line D2. Accordingly, different voltages are applied to the first subpixel electrode PE1 and the second subpixel electrode PE2. For example, a voltage that is higher than the voltage applied to the second subpixel electrode PE2 is applied to the first subpixel electrode PE1. On the contrary, a lower voltage than the voltage applied to the second subpixel electrode PE2 may be applied to the first subpixel electrode PE1.

Referring to FIG. 11, in the display device according to the present exemplary embodiment, each of the pixel transistors Tp of the pixels disposed in the same column is connected to different data lines D1 and D2 for every two pixels.

Gate lines G1, G2, G3, and G4 extend in a horizontal direction, and the data lines D1 and D2 extend in a vertical direction to cross the gate lines G1, G2, G3, and G4. Each of the pixels includes one gate line, a pixel transistor Tp connected with the data line, and a pixel electrode PE connected with the pixel transistor Tp.

In the case of a pixel disposed at a first column and a first row in the drawing, the pixel transistor Tp is connected to the first gate line G1 and the first data line D1. In the case of a pixel disposed at the first column and a second row, the pixel transistor Tp is connected to the second gate line G2 and the first data line D1. In the case of a pixel disposed at the first column and a third row, the pixel transistor Tp is connected to the third gate line G3 and the second data line D2. In the case of a pixel disposed at the first column and a fourth row, the pixel transistor Tp is connected to the fourth gate line G4 and the second data line D2

As a result, each of the pixel transistors Tp of the pixels adjacent to each other in a column direction is connected to different data lines for every two pixels.

According to the exemplary embodiments, it is possible to provide a display device including a gate driver capable of facilitating defect inspection of a gate line.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a display panel comprising a plurality of pixels;
a plurality of gate lines disposed in the display panel and configured to transfer gate signals to the pixels;
a gate driver disposed in the display panel and comprising a plurality of stages configured to generate gate signals and output the gate signals to the gate lines;
a substrate in which the gate pad, the first gate line, and the second gate line are disposed;
a gate insulating layer disposed on the substrate, the gate pad, the first gate line, and the second gate line;
a stage connection line disposed on the gate insulating layer and connected with the first stage; and
a passivation layer disposed on the gate insulating layer and the stage connection line,
wherein:
a first one of the stages is connected with a first one and a second one of the gate lines through a gate pad;
the gate pad comprises a first gate pad, a second gate pad, and a third gate pad; and
the first gate pad, the second gate pad, and the third gate pad are connected with each other through a gate pad connecting member; and
the gate pad connecting member is disposed on the passivation layer.

2. The display device of claim 1, further comprising a stage connecting member disposed on the passivation layer to connect the third gate pad and the stage connection line.

3. The display device of claim 2, wherein:
the first gate pad is connected with the first gate line;
the second gate pad is connected with the second gate line; and
the third gate pad comprises a gate pad extension connected with the stage connection line.

4. The display device of claim 3, wherein:
the passivation layer includes a pad first contact hole, a pad second contact hole, a stage first contact hole, and a stage second contact hole;
the pad first contact hole overlaps the gate pad and the second gate pad;
the pad second contact hole overlaps the third gate pad;
the stage first contact hole overlaps the gate pad extension; and
the stage second contact hole overlaps the stage connection line.

5. The display device of claim 4, wherein:
the gate pad connecting member connects the first gate pad and the third gate pad through the pad first contact hole and the pad second contact hole;
the gate pad connecting member connects the second gate pad and the third gate pad through the pad first contact hole and the pad second contact hole; and
the gate pad connecting member connects the first gate pad and the second gate pad through the pad first contact hole.

6. The display device of claim 5, wherein the stage connecting member connects the gate pad extension and the stage connection line through the stage first contact hole and the stage second contact hole.

7. The display device of claim 6, wherein one of the pixels comprises:
a gate electrode disposed on the substrate;
a semiconductor layer disposed on the gate insulating layer;
a source electrode and a drain electrode disposed on the gate insulating layer and the semiconductor layer to be separated from each other; and
a pixel electrode disposed on the passivation layer, and connected with the drain electrode.

8. The display device of claim 7, wherein:
the gate pad and the gate electrode include a same material;
the stage connection line, the source electrode, and the drain electrode include a same material; and
the pixel electrode, the gate pad connecting member, and the stage connecting member include a same material.

9. The display device of claim 1, further comprising a plurality of data lines disposed on the display panel to transfer data signals to the pixels,
wherein:
the pixels are disposed in a form of a plurality of rows and a plurality of columns; and
one of the pixels includes a pixel transistor connected to one of the gate lines and one of the data lines, and a pixel electrode connected with the pixel transistor.

10. The display device of claim 9, wherein the pixel transistors of the pixels adjacent to each other in a column direction are connected to a same data line.

11. The display device of claim 9, wherein the pixel transistors of the pixels adjacent to each other in a column direction are connected to different data lines.

12. A display device comprising:
a display panel comprising a plurality of pixels;
a plurality of gate lines disposed in the display panel and configured to transfer gate signals to the pixels;
a gate driver disposed in the display panel and comprising a plurality of stages configured to generate gate signals and output the gate signals to the gate lines; and
a plurality of data lines disposed on the display panel to transfer data signals to the pixels,
wherein:
a first one of the stages is connected with a first one and a second one of the gate lines through a gate pad;
the gate pad comprises a first gate pad, a second gate pad, and a third gate pad;
the first gate pad, the second gate pad, and the third gate pad are connected with each other through a gate pad connecting member;
the pixels are disposed in a form of a plurality of rows and a plurality of columns;
one of the pixels includes a pixel transistor connected to one of the gate lines and one of the data lines, and a pixel electrode connected with the pixel transistor;
the pixel electrode comprises a first subpixel electrode and a second subpixel electrode which are separated from each other;
the pixel transistor comprises a first pixel transistor connected with the first subpixel electrode and a second pixel transistor connected with the second subpixel electrode; and
the first pixel transistor and the second pixel transistor are connected with different data lines.

13. A display device comprising:
a display panel comprising a plurality of pixels;
a plurality of gate lines disposed in the display panel and configured to transfer gate signals to the pixels;
a gate driver disposed in the display panel and comprising a plurality of stages configured to generate gate signals and output the gate signals to the gate lines; and a plurality of data lines disposed on the display panel to transfer data signals to the pixels, wherein:

a first one of the stages is connected with a first one and a second one of the gate lines through a gate pad;

the gate pad comprises a first gate pad, a second gate pad, and a third gate pad;

the first gate pad, the second gate pad, and the third gate pad are connected with each other through a gate pad connecting member;

the pixels are disposed in a form of a plurality of rows and a plurality of columns;

one of the pixels includes a pixel transistor connected to one of the gate lines and one of the data lines, and a pixel electrode connected with the pixel transistor; and the pixel transistors of the pixels adjacent to each other in a column direction are connected to different data lines for every two pixels.

* * * * *